United States Patent
Hikita et al.

[11] Patent Number: 6,054,648
[45] Date of Patent: Apr. 25, 2000

[54] SHIELD CASE FOR A SEMICONDUCTOR OPTICAL DEVICE

[75] Inventors: Hiroaki Hikita; Shigehiro Murakawa, both of Kyoto, Japan

[73] Assignee: Rohm Co., Ltd., Kyoto, Japan

[21] Appl. No.: 09/238,329

[22] Filed: Jan. 27, 1999

[30] Foreign Application Priority Data

Jan. 28, 1998 [JP] Japan ................... 10-054093
Jan. 28, 1998 [JP] Japan ................... 10-054096

[51] Int. Cl.⁷ ........................................... H05K 9/00
[52] U.S. Cl. .................... 174/35 R; 174/35 GC; 361/816; 257/680; 257/660; 257/432; 257/726; 257/727
[58] Field of Search .............. 174/35 R, 35 GC, 174/52.1, 138 G; 361/816, 807, 809, 810, 811, 818, 806; 257/680, 659, 660, 681, 432, 433, 434, 726, 727; 313/524

[56] References Cited

U.S. PATENT DOCUMENTS

| | | | |
|---|---|---|---|
| 4,282,597 | 8/1981 | Yenawine et al. | 368/280 |
| 5,550,675 | 8/1996 | Komatsu | 359/514 |
| 5,742,004 | 4/1998 | Greco et al. | 174/35 R |
| 5,949,019 | 9/1999 | Sirainen | 174/35 R |

FOREIGN PATENT DOCUMENTS

| | | |
|---|---|---|
| 2-216898 | 8/1990 | Japan . |
| 64889 | 10/1990 | Japan . |
| 3-57949 | 6/1991 | Japan . |
| 8-88494 | 4/1996 | Japan . |

*Primary Examiner*—Kristine Kincaid
*Assistant Examiner*—W. David Walkenhorst
*Attorney, Agent, or Firm*—Hoffman & Baron, LLP

[57] ABSTRACT

A shield case is formed by bending one sheet of a magnetic metal plate that is generally in a T-character form, which has a top plate, two side plates sandwiching the top plate, and a back plate extending from a rear edge of the top plate and sandwiched between the side plates. A semiconductor optical device is placed between the side plates, and elastically held at its side surfaces by clamp pieces formed in the side plates. By inwardly bending the back plate to a position in parallel to the top plate, the semiconductor optical device at its back and bottom surfaces is shielded. The side surfaces and light-receiving/light-emitting surface of the semiconductor optical device are respectively shielded by the side plates and the top plate.

12 Claims, 4 Drawing Sheets

F I G. 7
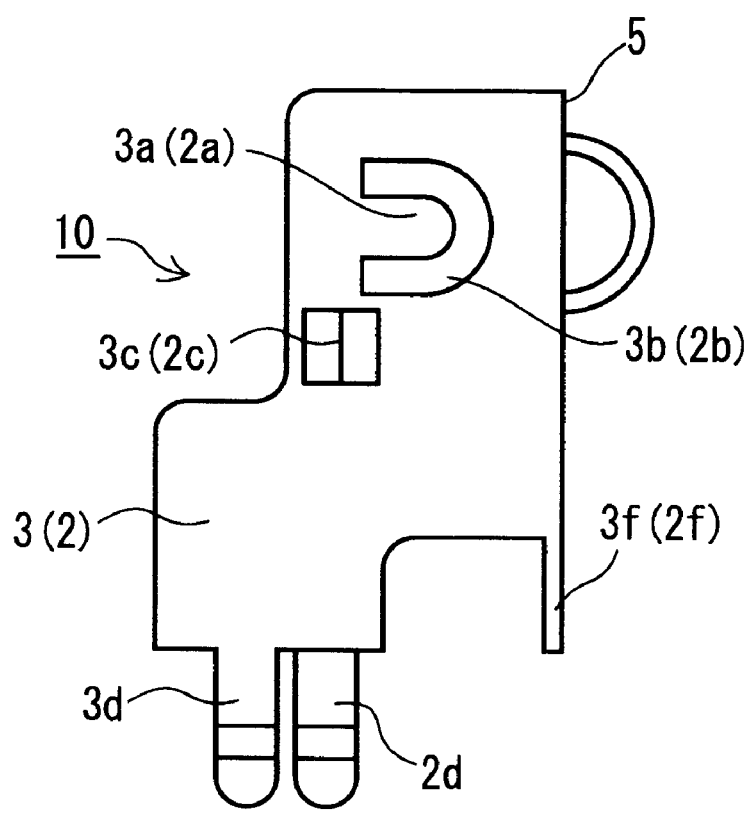

SHIELD CASE FOR A SEMICONDUCTOR OPTICAL DEVICE

BACKGROUND OF THE INVENTION

1. Field of the Invention

The present invention relates to a shield case for a semiconductor optical device. More specifically, the invention relates to a shield case to be mounted onto a circuit board with a semiconductor light-emitting or light-receiving device (may be hereinafter referred to as a "semiconductor optical device" as a general term inclusive for both the semiconductor light-emitting and light-receiving devices) placed therein shielded electromagnetically.

2. Description of the Prior Art

In a semiconductor optical device of this kind, a semiconductor light-emitting or light-receiving element (maybe hereinafter referred to as a "semiconductor optical device") is wire-bonded through metal wires to a plurality of lead terminals and then encapsulated by a mold resin into an encapsulated body in a rectangular parallelepiped form. This encapsulated body has, at a top surface, a transparent (or semi-transparent) semi-spherical lens formed of a synthetic resin covering over the semiconductor optical device. That is, the semiconductor optical device of this kind is generally in rectangular parallelepiped form having lead terminals extending outward through one surface of the encapsulated body.

There are cases that such a semiconductor optical device is mounted on a circuit board through using the lead terminals. In such cases, there encounters a problem that the mount stability becomes poor due to insufficiency in mechanical strength of the lead terminals and the affection of noises caused by the absence of a shield structure for prevention against electromagnetism.

Under such circumstances, a shield case formed by a magnetic metal plate, e.g., iron plate, having high magnetic permeability has been conventionally used, wherein the magnetic metal plate is blanked generally in a rectangular shape having opposite mount legs so that the magnetic metal plate is bent into an arch form having a top plate and opposite side plates. In the conventional shield case, the top plate has an opening through which a light-receiving/light-emitting surface of the semiconductor optical device is exposed while the side plates retain the semiconductor optical device therebetween. That is, the conventional shield case provides electromagnetic shield for the semiconductor optical device at three faces in total, i.e., the light-receiving/light-emitting surface except for a region of the opening plus opposite side surfaces. Due to this, the semiconductor optical device can be shielded from electromagnetism with enhanced mount stability.

However, the conventional shield case involved a problem to be dissolved. That is, where utilizing the conventional shield case, the semiconductor optical device has been held by providing inward projections from the side plates or otherwise by attaching a separate fixing member to the inward of the side plates. In the former case, there has been a problem that there is difficulty in stably holding the semiconductor optical device. On the other hand, in the latter case the structure is complicated and hence cost is expensive.

Moreover, because the conventional shield case is in the arch form, the semiconductor optical device is shielded at only three surfaces among six surfaces but the remaining three surfaces are left open, thus insufficiency in the effect of shield.

SUMMARY OF THE INVENTION

Therefore, it is a primary object of the present invention to provide a novel shield case for a semiconductor optical device.

It is another object of the present invention to provide a shield case for a semiconductor optical device which is cheap in price and easy to sustain a semiconductor optical device therein.

It is further object of the present invention to provide a shield case for a S semiconductor optical device which has an improved shield effect.

A shield case according to the present invention is a shield case formed by bending an elongate magnetic metal plate, comprising: a top plate having two sets of opposite sides, the top plate being formed with an opening through which a light-receiving/light-emitting surface of a semiconductor optical device is exposed; two sides plates respectively extending from one set of opposite sides of the top plate, the side plates having respective mount legs formed at tips thereof; and clamp pieces respectively formed in inner surfaces of the side plates and bent inward to elastically hold the semiconductor optical device.

According to the present invention, curved clamp pieces are respectively formed in inner surfaces of the opposite side plates so that the semiconductor optical device is elastically held by these clamp pieces. Accordingly, the shield case obtained can hold a semiconductor optical device with simplicity and low cost, different from the conventional shield case.

In one aspect of the present invention, the magnetic metal plate is formed generally in a T-character form. The bending of this T-character formed magnetic metal plate provides a back plate in addition to the top and side plates. The back plates extends from one side sandwiched between the side plates. The back plate, after placing a semiconductor optical device between the side plates, is bent at a predetermined position with respect to a lengthwise direction. In this case, engaging portions may be formed in respective inner surfaces of the side plate in order to engage with a bent tip of the back plate. The formation of the engaging portions enables the bent back plate to be stably fixed.

In this aspect, the semiconductor optical device is shielded at back and bottom faces by the back plate, at opposite side faces by the side plates, and at at light-receiving/light-emitting surface by the top plate. Accordingly, the semiconductor optical device has an increased number of faces that are shielded by the shield case as compared with the conventional shield case, thus further improving shield effects.

In order to bend the back plate, a readily bendable portion is formed at a predetermined position in the back plate so that the back plate can be inwardly bent at the readily bendable portion. The readily bendable portion may include punched holes. According to this embodiment, the back plate can be easily bent at the predetermined position after accommodating the semiconductor optical device within the shield case.

In a shield case of an embodiment formed with the back plate, stepped portions may be formed in side edges of the side plates at positions the back plate is perpendicularly transverse, which having respective lengths symmetric with respect to the top plate with a thickness of the magnetic metal plate, wherein the sides plates and the back plate are bent with respect to the top plate as a center and the back plate is registered with the step portions. Due to this, gaps are eliminated from the back plate and the side plates. Accordingly, the shield effect is further improved.

Incidentally, the light-receiving/light-emitting surface of the semiconductor optical device can be set in a direction perpendicular to a circuit board.

In an preferred embodiment of the present invention, a shield case formed by bending a magnetic metal plate generally in a T-character form, comprises: a top plate having two sets of opposite sides, the top plate being formed with an opening through which a light-receiving/light-emitting surface of a semiconductor optical device is exposed; two side plates respectively extending from one set of opposite sides of the top plate, the side plates respectively having mount legs formed at tips thereof and engaging portions formed in inner surfaces of the side plates at positions opposite to each other; a back plate extending from one side of the top plate sandwiched between the side plates, the back plate being inwardly bent at a predetermined position in a lengthwise direction and engaged with the engaging portions; and holding portions respectively formed in the inner surfaces of the side plates to hold opposite side surfaces of the semiconductor optical device, wherein the light-receiving/light-emitting surface of the semiconductor optical device is shielded by the top plate, back and bottom surfaces of the semiconductor optical device being shielded by the back plate, and opposite side surfaces of the semiconductor optical device being shielded by the side plates.

In the preferred embodiment of the present invention, there are obtained two advantages that the semiconductor optical device is easy to hold and that the semiconductor optical device is shielded at its faces increased in number.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a backside view of the metal plate in a state the back plate is bent with a semiconductor optical device is placed in;

FIG. 7 is a side view showing a shield case according to still another embodiment of the present invention.

DETAILED DESCRIPTION OF THE PREFERRED EMBODIMENTS

Figure 1:
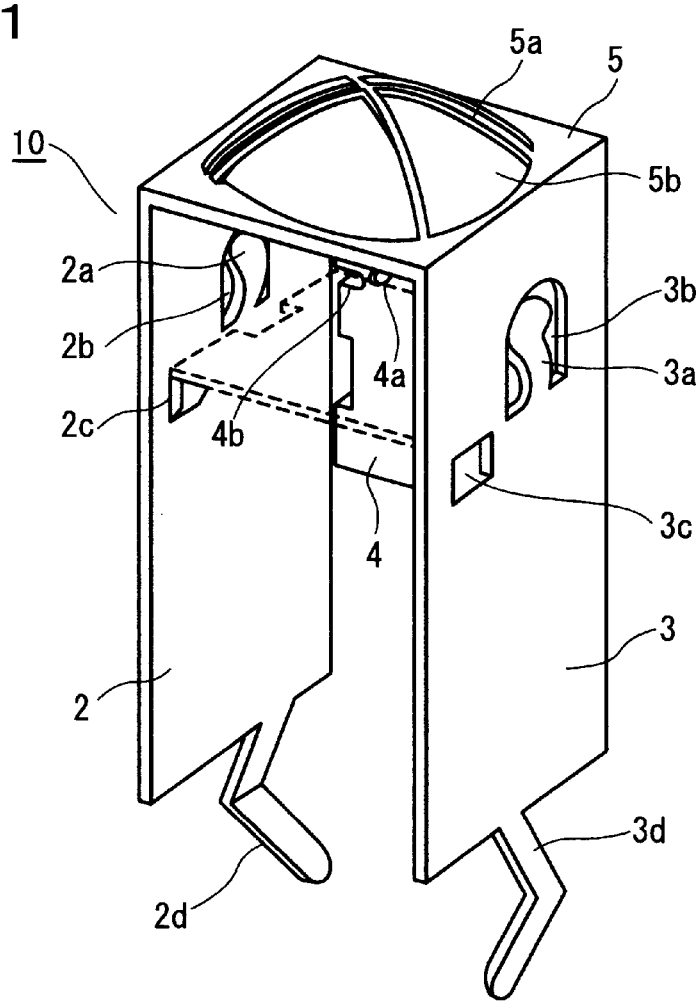
FIG. 1 is a perspective view showing a shield case according to one embodiment of the present invention.

Referring to FIG. 1, there is depicted a shield case 10 according to one embodiment of the present invention. This shield case 10 can be formed by bending a T-character formed magnetic metal plate 1 having a high magnetic permeability.

The magnetic metal plate 1 has a top plate 5 centrally positioned and having four sides, side plates 2 and 3 respectively extending from opposite sides of the top plate 5 and positioned symmetrical with respect to the top plate 5, and a back plate 4 extending from the top plate 5 in a direction perpendicular to each of the side plates 2 and 3. By bending the both side plates 2 and 3 as well as the back plate 4 respectively along bend portions A, B and C with the top plate 5 taken as a center, a box-like member can be obtained which is open at two faces. A shield case 10 is formed, as described later, by fitting a semiconductor optical device within the box-like member and then bending the back plate 4 inward of the box-like member to a position parallel with the top plate 5, as shown by broken lines in FIG. 1.

A horseshoe-shaped blanked space 2b is formed in the side plate 2, and a clamp piece 2a is formed along the blanked space 2b. The clamp piece 2a is curved inward of the shield case 10 by bending. That is, the clamp piece 2a is formed as a tongue rising from the side plate 2. The side plate 2 also has an embossed portion 2c having a surface formed in a rectangular recess. This embossed portion 2c is formed in a slant surface that is slanted slightly inward of the side plate 2 surface from one side of the rectangular recess. The embossed portion 2c serves as an engaging portion for engagement with the bent pack plate, as stated later. The side plate 2 is formed, at its tip, with a mount leg 2d for enabling mounting onto a circuit board. This mount leg 2d is bent outward of the shield case 10 by bending, as will be well understood from FIG. 1.

In the side plate 3, there are also provided a clamp piece 3a, a horseshoe-shaped blanked space 3b, an embossed portion 3c and a leg 3d for mounting onto a circuit board, similarly to the side plate 2. Here, these clamp piece 3a, hose-shaped blanked space 3b and embossed portion 3c of the side plate 3 are respectively symmetrical in position, about the top place 5, to the clamp piece 2a, hose-shaped blanked space 2b and embossed portion 2c of the side plate 2. However, the mount leg 2d of the side plate 2 and the mount leg 3d of the side plate 3 are different in position with reference to a widthwise center of the side plate 2, 3. The placement of the mount legs 2d, 3d at different positions with reference to the widthwise center of the side plates 2, 3 serves for load distribution and hence increase in stability, when mounting the shield case 10 fitted with a semiconductor optical device onto a circuit board.

The back plate 4 is formed with punched holes 4a and punched grooves 4b. The back plate 4 is bent inward of the box-like member, at a position that the punched hole s 4a and the punched groove s 4b are formed, into a position in parallel to the top plate 5. The bent back plate 4 covers over a bottom of the semiconductor optical device that is elastically held by the respective clamp pieces 2a and 3a of the side plates 2 and 3. The provision of the punched holes 4a and the punched grooves 4b serves to decrease mechanical strength, and the back plate 4 can be easily bent at this position. The top plate 5 is formed with a cross-shaped shield 5a in a semispherical form extending outward, and an opening 5b. As explained before, the semiconductor optical device is provided with a semi-spherical lens that is transparent or semi-transparent. Accordingly, when the semiconductor optical device is fitted within the shield case 1, the lens exposed to the opening 5b is partly covered by the cross-shaped shield 5a.

Now a procedure for forming a shield case 10 will be explained with reference to the perspective view of FIG. 1 as well as the back side view of FIG. 3. Note that in FIG. 3 the semiconductor optical device is shown by hatching.

The semiconductor optical device includes an encapsulated body (main body) 22 having a semiconductor optical element (not shown) encapsulated therein and a semispherical lens projecting from one (light-receiving/light-emitting) surface of the main body 22. The main body 22 has a lead terminal 23 for grounding, a lead terminal 24 for outputting signals, and a lead terminal 25 to be connected to a power source Vcc, which extend outward through one surface of the main body 22.

The magnetic metal plate 1 generally in a T-form, as shown in FIG. 1, is bent such that the both side plates 2 and 3 and the center top plate 5 into a squared arch form. Then the back plate 4 is bent to a direction perpendicular to side edges of the side plates 2 and 3, thereby forming a box-like member that is open to outside at two faces. Next, the semiconductor optical device is inserted inside the box-like body such that the lens 21 is exposed to the opening 5b but covered by the cross-shaped shield 5a of the top plate 5. The semiconductor optical device is held in position by an elastic force that is applied by the clamp pieces 2a and 3a of the side plates 2 and 3 to the opposite side faces of the main body 22.

In this manner, the semiconductor optical device can be fixed within the box-like member in a one-touch fashion by virtue of the clamp pieces 2a and 3a provided in the side plates 2 and 3. Furthermore, such elastic force is at all times applied to the side faces of the semiconductor optical device through the clamp pieces 2a and 3a. It is accordingly possible to stably position the semiconductor optical device within the shield case 10.

In a state that the semiconductor optical device is held within the box-like member by applying an elastic force through the clamp pieces 2a and 3a, the back plate 4 is bent inward at a position of the punched holes and grooves 4a, 4b into a position in parallel to the top plate 5. Thus, the box-like member is closed in its one open face to thereby cover over the bottom of the semiconductor optical device main body. The respective embossed portions 2c, 3c of the side plate 2, 3 are formed projecting inward of the shield case 10 due to the formation of the rectangular recess on the outer surface The bent tip of the back plate 4 is engaged with and fixed on the inwardly projecting rectangular corner portions. As described before, because the rectangular recesses are formed in a surface slightly inwardly slanted from one side of the recess, the tip portion of the back plate 4 being bent is allowed to smoothly get over the slant surfaces, being engaged at the recess corners.

Because the tip portion of the bent back plate 4 are engaged by the respective corners of the rectangular inward projections on the side plates 2 and 3, the bent portion of the back plate 4 is positively fixed thereon. This inward bending of the back plate 4 results in covering over back and bottom faces of the semiconductor optical device. Furthermore, because the bent portion of the back plate 4 is fixed at the inner surface of the side plates 2 and 3, the back plate 4 is also provided with a function of stably holding the semiconductor optical device without movement in the shield case 10.

The lead terminals 23, 24 and 25 of the semiconductor optical device are taken out through an open face of the shield case 10 that is on a side opposite to the back plate 4, which are connected to a conductor pattern formed on a circuit board.

In this manner, the sides plate 2 and 3 and the back plate 4 covers over three of the four side surfaces of the semiconductor optical device, excepting for the surface through which the lead terminals extends. Also, the top surface of the optical device is covered by the bent back plate 4, excepting for the exposed light-receiving/light-emitting surface (lens 21). Further, the bottom face of the semiconductor optical device is covered by the bent back plate 4. The shield effect for the semiconductor optical device is improved. This is because the semiconductor optical device formed generally in a rectangular parallelepiped form is shielded at five faces thereof by means of the magnetic metal plate. FIG. 4 is a side view of a shield case 10 according to an embodiment of the present invention. In the embodiment explained with referring to FIG. 1 to FIG. 3, the light-receiving/light-emitting surface (surface on which the lens is formed) of the semiconductor optical device was provided in a direction parallel to the circuit board. In the embodiment of FIG. 4, the light-receiving/light-emitting surface can be provided in a direction perpendicular to the circuit board if the side plates 2 and 3 are formed in an inverted L-character form. According to the present embodiment wherein the light-receiving/light-emitting surface of the semiconductor optical device can be changed in direction relative to the circuit board, it is possible to increase the freedom in arranging the semiconductor optical device on the circuit board.

Figure 2:
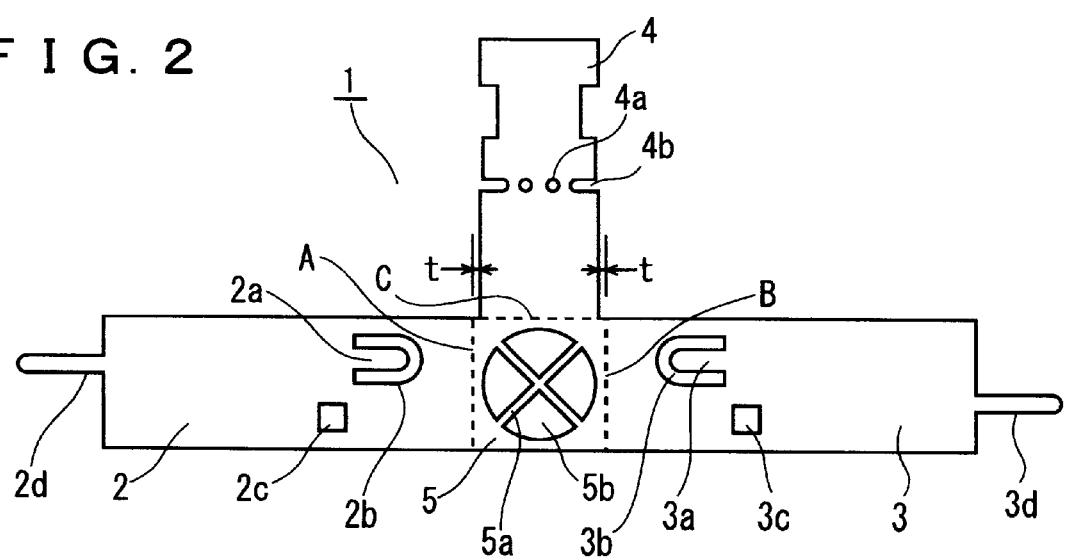
FIG. 2 is a development view showing a magnetic metal plate used in the FIG. 1 embodiment.
Figure 3:
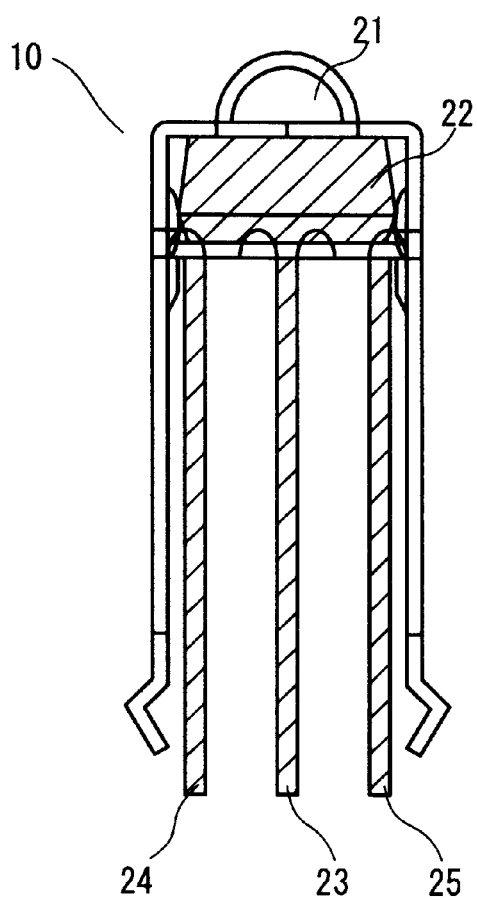
Figure 4:
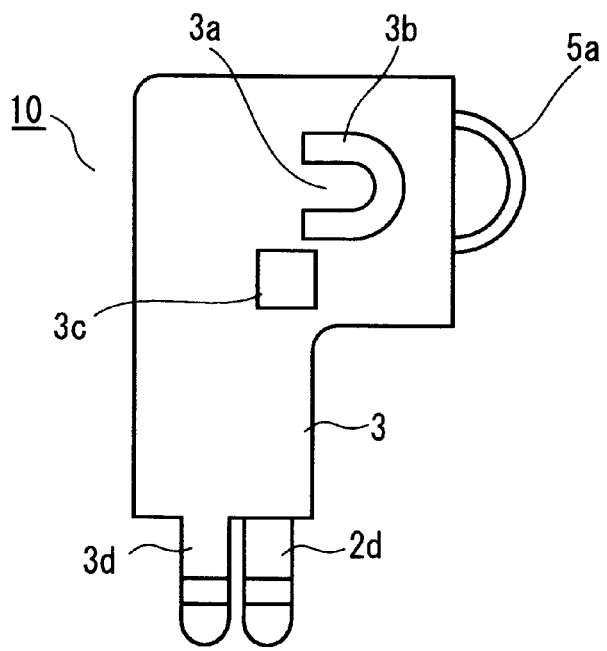
FIG. 4 is a side view showing a shield case according to another embodiment of the present invention.

In the meanwhile, in the shield case explained referring to FIGS. 1 to 3, the back plate 4 was bent perpendicular to side edges of the side plates 2 and 3 in a manner sandwiched therebetween. Accordingly, a small gaps t is given between the side edge of the back plate 4 and an extension of the bend portion A, B, as shown in FIG. 2. Due to this, there is a fear that, when forming the shield case 10, the back plate 4 is insufficient in shield effect resulting in decrease in shield effect for the semiconductor optical device.

Now a shield case according to another embodiment will be explained with reference to FIGS. 5 and 6, wherein no small gaps are caused between the back plate 4 and the side plates 2 and 3.

Figure 5:
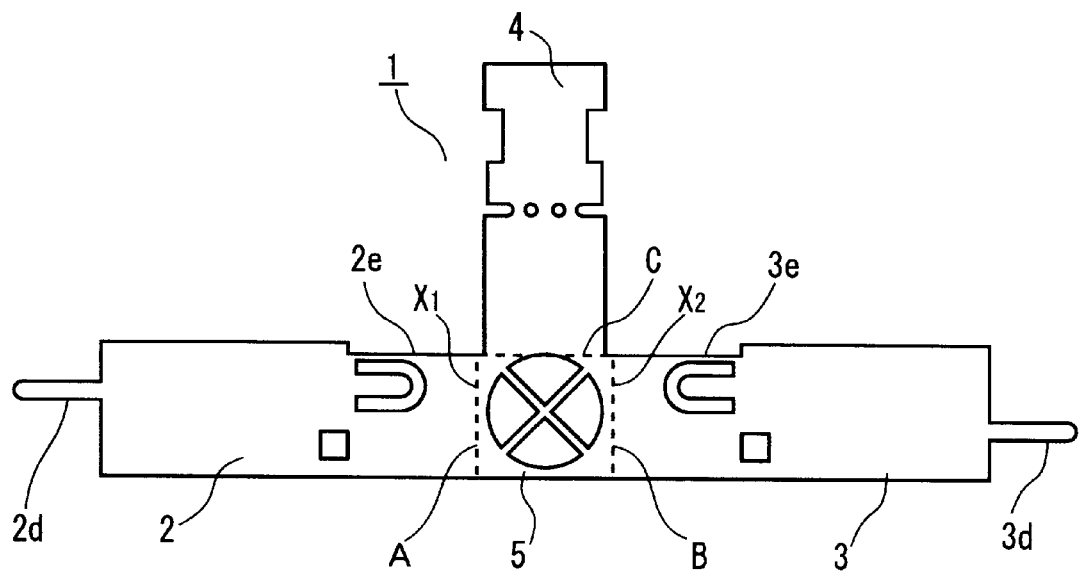
FIG. 5 is a development view showing a shield case according to still another embodiment of the present invention.
Figure 6:
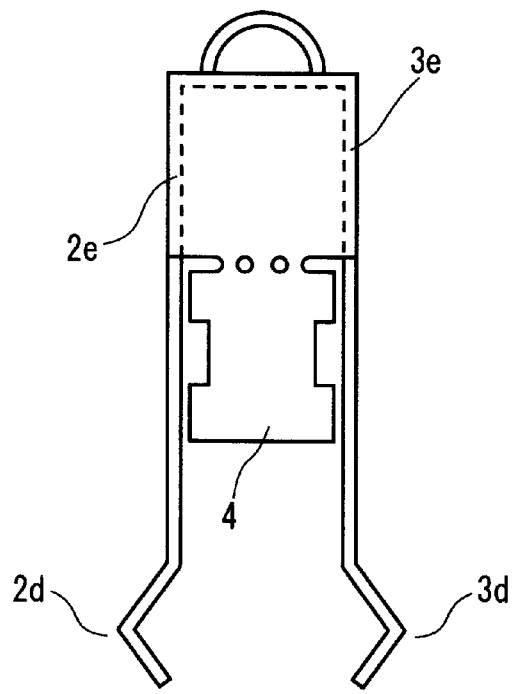
FIG. 6 is a backside view showing the shield case of the FIG. 5 embodiment.

FIG. 5 is a development view of a magnetic metal plate 1 to be used in this other embodiment of the present invention, while FIG. 6 is a back side view of a box-like member formed by bending this magnetic metal plate 1. The parts or elements same as or correspond to those of FIGS. 1 to 3 are denoted by the same reference characters, omitting concrete explanation.

In this other embodiment, step portions 2e and 3e are formed in one side edges of the side plates 2 and 3 extending perpendicular to the back plate 4, as shown in FIGS. 5 and 6. The step portions 2e and 3e each have a depth in dimension corresponding to a thickness of the magnetic metal plate 1. The length of the step portions 2e and 3e are determined to be a length of between the positions of the bend portion C and the punched holes and grooves 4a, 4b of the back plate 4. The back plate 4 has its side edges respectively positioned at X1 and X2 which is outside by the thickness of the magnetic metal plate 1 from bend portions A and B. Cut-in is provided in each of the side edges at X1 and X2.

Utilizing the side plates 2 and 3 having step portions 2e and 3e in their one side edges, the magnetic metal plate 1 is bent at bend portions A, B and C into a shield case 10. The back plate 4 is registered onto the step portions 2e and 3e over its length between the top plate 5 and the position of the punched hole and groove 4a and 4b, as shown in FIG. 6. Thus no gaps are caused between the back plate 4 and the side plate 2, 3. Due to this, it is possible to further improve the effect for shielding the semiconductor optical device placed within the shield case 10.

Incidentally, the formation of the shield case 10 using the side plates 2 and 3 having step portions 2e and 3e at one side edges, as explained in FIGS. 5 and 6, is also applicable to the case as shown in FIG. 4 using the inverted L-formed side plates 2 and 3.

In the above embodiment, the shield case 10 was formed by using the magnetic metal plate 1 which was generally in the T-form and has the side plates 2 and 3, back plate 4 and top plate 5, as shown in the development view of FIG. 2, wherein the side plates 2 and 3 and the back plate 4 were bent with the top plate 5 taken as the center. However, the present invention is also applicable to a shield case having a structure, for example, that an elongate magnetic metal plate without having a part corresponding to the back plate 4 is merely bent to a squared arch form. In the case of a structure that a simple-formed magnetic metal plate is bent into an squared arch form, if inwardly curved clamp pieces are formed in the respective side plates to elastically support the semiconductor optical devices through the clamp pieces, it is possible to hold the semiconductor optical device within the shield case with simplicity and inexpensive cost in a manner similar to the case of FIGS. 1 to 3.

A shield case 10 shown in FIG. 7 is a modification to the FIG. 4 embodiment, which is changed in shape of the side plates 2 and 3 from those of the FIG. 4 embodiment. That is, in FIG. 4 embodiment the side plates 2 and 3 were formed in the inverted L-form so that the light-receiving/light-emitting surface could placed perpendicular to the circuit board. Contrary to this, in the FIG. 7 embodiment, although the direction of arranging the light-receiving/light-emitting surface is similar to that of the FIG. 4 embodiment, the side plates 2 and 3 are removed of unwanted portions (concretely, upper left portion of the side plate in FIG. 4) thereby reducing material cost and further decreasing the size. Furthermore, in this embodiment support legs 2f and 3f are respectively formed on the side plates 2 and 3 at an end close to the top plate 5. These support legs 2f and 3f are not inserted into a circuit board (not shown) but abutted at their tips against a surface of the circuit board, thereby preventing the shield case 10 from inclining toward the top plate 5. Therefore, these support legs 2f and 3f may be applied to the FIG. 4 embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A shield case formed by bending an elongate magnetic metal plate, comprising:
    a top plate having two sets of opposite sides, said top plate being formed with an opening through which a light-receiving/light-emitting surface of a semiconductor optical device is exposed;
    two side plates respectively extending from one set of opposite sides of said top plate, said side plates having respective mount legs formed at tips thereof; and
    clamp pieces respectively formed in inner surfaces of said side plates and bent inward to elastically hold said semiconductor optical device.

2. A shield case according to claim 1, wherein said magnetic metal plate is formed generally in a T-character form having a back plate extending from one side of said top plate sandwiched between said side plates, and said shield case further comprising:
    a back plate extending from one side of said top plate sandwiched between said side plates, said back plate being bent inward at a predetermined position with respect to a lengthwise direction, whereby
    back and bottom surfaces of said semiconductor optical device are shielded by said back plate while opposite side surfaces of said semiconductor optical device are shielded by said side plates.

3. A shield case according to claim 2, further comprising an engaging portion formed in said side plate, wherein said back plate thus bent is engaged with said engaging portion.

4. A shield case according to claim 3, further comprising a readily bendable portion formed at said predetermined position in said back plate, said back plate being bent inward at said readily bendable portion.

5. A shield case according to claim 2, further comprising a readily bendable portion formed at said predetermined position in said back plate, said back plate being bent inward at said readily bendable portion.

6. A shield case according to claim 5, wherein said readily bendable portion includes a punched hole.

7. A shield case according to claim 2, further comprising stepped portions formed in side edges of said side plates at positions where said back plate is perpendicularly transverse, and having respective lengths symmetric with respect to said top plate with a thickness of said magnetic metal plate, wherein said sides plates and said back plate are bent with respect to said top plate as a center and said back plate is registered with said step portions.

8. A shield case according to claim 1, wherein said clamp piece includes a tongue raised from said side plate.

9. A shield case according to claim 1, wherein said side plates are formed in an inverted L-character form, whereby said light-receiving/light-emitting surface of said semiconductor optical device is set in a direction parallel to a circuit board.

10. A shield case formed by bending a magnetic metal plate generally in a T-character form, comprising:
    a top plate having two sets of opposite sides, said top plate being formed with an opening through which a light-receiving/light-emitting surface of a semiconductor optical device is exposed;
    two side plates respectively extending from one set of opposite sides of said top plate, said side plates respectively having mount legs formed at tips thereof and engaging portions formed in inner surfaces of said side plates at positions opposite to each other;
    a back plate extending from one side of said top plate sandwiched between said side plates, said back plate being inwardly bent at a predetermined position in a lengthwise direction and engaged with said engaging portions; and
    holding portions respectively formed in said inner surfaces of said side plates to hold opposite side surfaces of said semiconductor optical device, wherein
    said light-receiving/light-emitting surface of said semiconductor optical device is shielded by said top plate, back and bottom surfaces of said semiconductor optical device being shielded by said back plate, and opposite side surfaces of said semiconductor optical device being shielded by said side plates.

11. A shield case according to claim 10, said holding portions include respective clamp pieces formed in said inner surfaces of said side plates and bent inward to elastically hold said semiconductor optical device.

12. A shield case according to claim 11, wherein said clamp piece includes a tongue raised from said side plate.

* * * * *